（12） United States Patent
Chang et al.

(10) Patent No.: US 12,198,777 B2
(45) Date of Patent: Jan. 14, 2025

(54) READ WINDOW MANAGEMENT IN A MEMORY SYSTEM

(71) Applicant: Micron Technology, Inc., Boise, ID (US)

(72) Inventors: Li-Te Chang, San Jose, CA (US); Murong Lang, San Jose, CA (US); Zhenming Zhou, San Jose, CA (US); Ting Luo, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 17/812,612

(22) Filed: Jul. 14, 2022

(65) Prior Publication Data

US 2024/0021264 A1    Jan. 18, 2024

(51) Int. Cl.
| | | |
|---|---|---|
| *G11C 16/10* | (2006.01) | |
| *G11C 16/26* | (2006.01) | |
| *G11C 29/00* | (2006.01) | |
| *G11C 29/50* | (2006.01) | |
| *G11C 29/52* | (2006.01) | |

(52) U.S. Cl.
CPC ........ *G11C 29/52* (2013.01); *G11C 29/50004* (2013.01); *G11C 29/783* (2013.01)

(58) Field of Classification Search
CPC . G11C 29/52; G11C 29/50004; G11C 29/783; G11C 11/5628; G11C 16/0483; G11C 16/3418; G11C 2029/0409; G11C 11/5642; G11C 29/021; G11C 29/028; G11C 16/3404; G11C 16/26; G06N 20/00
See application file for complete search history.

(56) References Cited

U.S. PATENT DOCUMENTS

| | | | |
|---|---|---|---|
| 2007/0271494 A1* | 11/2007 | Gorobets | G06F 11/1068 |
| | | | 714/763 |
| 2019/0378583 A1* | 12/2019 | Lien | G11C 16/10 |
| 2019/0391914 A1* | 12/2019 | Hsiao | G11C 11/5642 |
| 2020/0174667 A1* | 6/2020 | Lee | G06F 3/061 |
| 2022/0261153 A1* | 8/2022 | Papa | G06F 3/0652 |
| 2023/0068324 A1* | 3/2023 | Drissi | G06F 3/0679 |
| 2023/0148206 A1* | 5/2023 | Guo | G11C 16/26 |
| | | | 365/189.011 |
| 2023/0367504 A1* | 11/2023 | Cerafogli | G06F 3/0604 |

* cited by examiner

*Primary Examiner* — Hien N Nguyen
(74) *Attorney, Agent, or Firm* — Holland & Hart LLP

(57) ABSTRACT

Methods, systems, and devices for read window management in a memory system are described. A memory system may determine, for a set of memory cells, a first value for a read window that is associated with a set of one or more threshold voltages each representing a different multi-bit value. The memory system may then use the first value for the read window to predict a second value for the read window. Based on the second value for the read window, the memory system may predict an error rate for the set of memory cells. The memory system may then set a value for an offset for a threshold voltage of the set of one or more threshold voltages based on the error rate.

13 Claims, 8 Drawing Sheets

| Read Window | Components |
|---|---|
| Read Window A (XP) | v2, v6 |
| Read Window B (UP) | v1, v3, v5 |
| Read Window C (LP) | e1, v4 |

READ WINDOW MANAGEMENT IN A MEMORY SYSTEM

FIELD OF TECHNOLOGY

The following relates to one or more systems for memory, including read window management in a memory system.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A memory system may use respective threshold voltages of memory cells to store information. For example, the memory system may, via a write operation, set the threshold voltages of memory cells to a set of target values each of which represents a different bit value (e.g., a single-bit value, a multi-bit value). However, variations in memory cells (or other aspects of the memory system) may result in a distribution of threshold voltages for memory cells written to the same target value. Further, after writing and over time, the threshold voltages of memory cells may drift (e.g., shift down, shift from an original position), a phenomenon that may be referred to as slow charge loss, charge loss, or threshold voltage drift. Threshold voltage drift may in some examples compress the distance between adjacent threshold voltage distributions (which may be referred to as read windows), which in turn may negatively impact read performance, among other disadvantages.

According to the techniques described herein, a memory system may compensate for threshold voltage drift (and thus improve performance) by adaptively updating the offset values used (e.g., during write operations) to set the threshold voltages of memory cells. To do so, the memory system determines a set of distribution curves for threshold voltages of a set of recently written memory cells and, using that set of distribution curves, determines the sizes of read windows associated with various subsets of the distribution curves. The memory system may then use the sizes of the read windows to predict (e.g., via a machine learning model) the sizes of the read windows in the future. Additionally or alternatively, the memory system may predict future error rate(s) for set of memory cells based on a mapping (e.g., given by a look-up-table (LUT)) between the predicted sizes of the read windows and error rates. A read window may also be referred to as a program-erase window or other suitable terminology. The memory system may set offset values for the threshold voltages based on the predicted error. Thus, the memory system may adaptively set the offset values for threshold voltages, which may improve reliability relative to other techniques that rely on static threshold voltage offsets.

Figure 1:
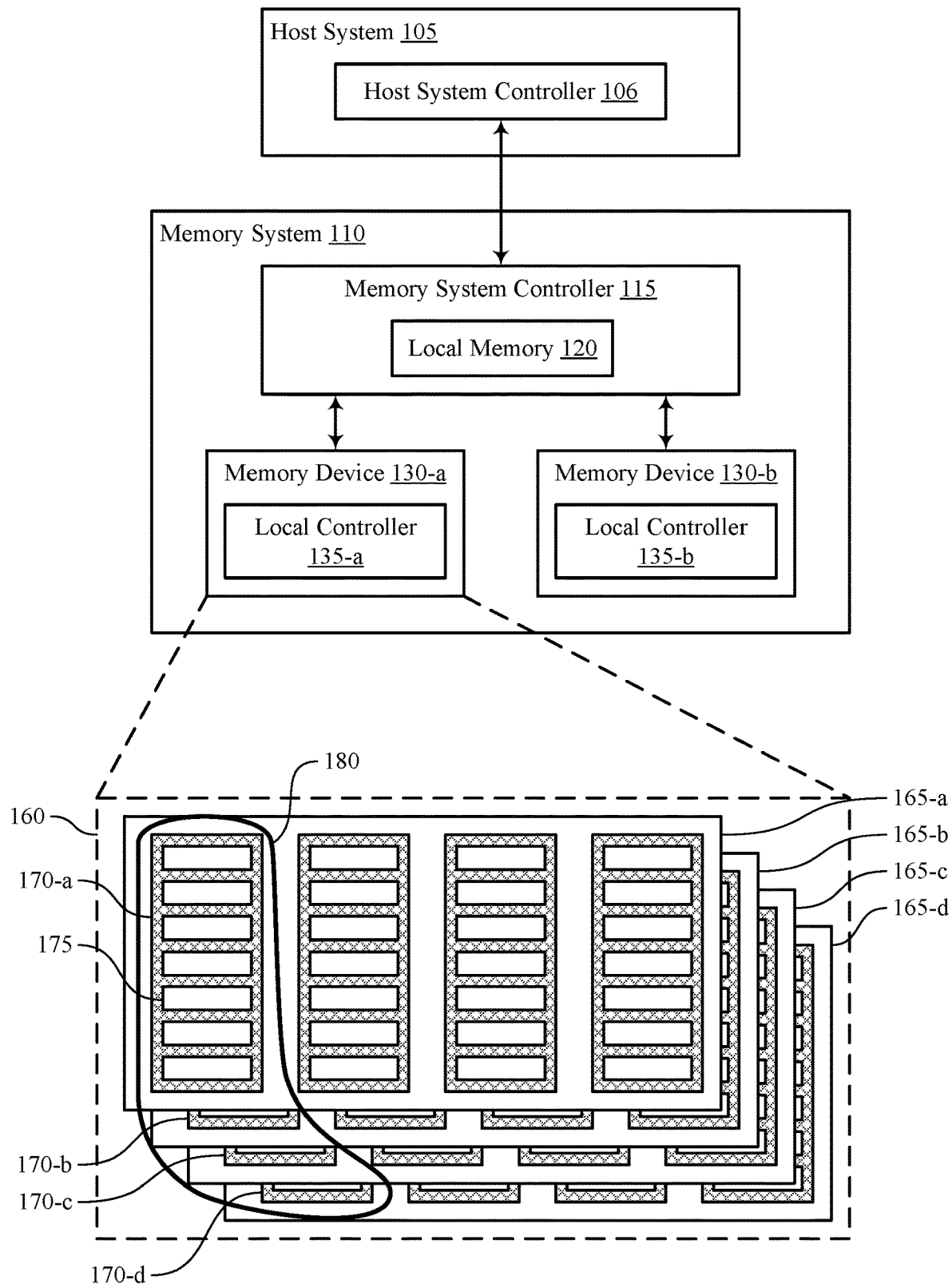
FIG. 1 illustrates an example of a system that supports read window management in a memory system in accordance with examples as disclosed herein.
Figure 2:
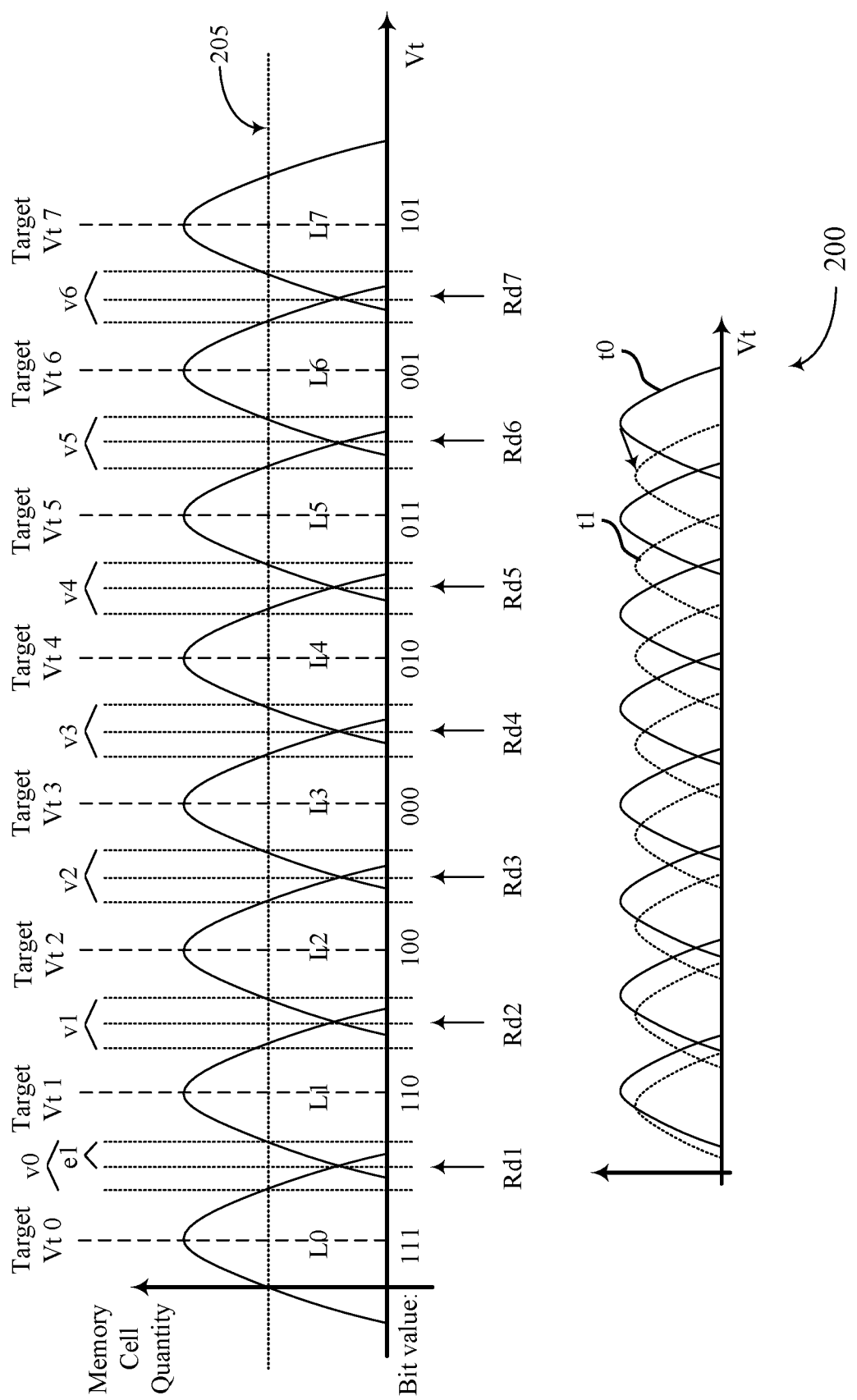
FIG. 2 illustrates an example of threshold distribution curves that support read window management in a memory system in accordance with examples as disclosed herein.

Features of the disclosure are initially described in the context of systems, devices, and threshold voltage distribution curves with reference to FIGS. 1 through 2. Features of the disclosure are described in the context of a processing path and flow charts with reference to FIGS. 3 through 5. These and other features of the disclosure are further illustrated by and described in the context of an apparatus diagram and flowcharts that relate to read window management in a memory system with reference to FIGS. 6 through 8.

FIG. 1 illustrates an example of a system 100 that supports read window management in a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

To write a bit value to a memory cell, the memory system 110 may bias the access lines of the memory cell so that the threshold voltage of the memory cell is set to a target value. But across a memory die, block, page, or other portion of memory, the threshold voltage of memory cells written with the same bit value may vary, resulting in a distribution of threshold voltages for that bit value. The memory cells may also suffer from slow charge loss or some other phenomenon that causes the threshold voltages to shift (e.g., drift down). Sufficiently large changes in threshold voltages may shrink the read windows and decrease the accuracy of read operations, which may negatively impact the data retention of the memory system 110. Data retention may refer to the length of time a system is able reliably store data.

According to the techniques described herein, the memory system 110 may improve data retention by adaptively setting offset values for writing memory cells so that the memory system 110 can reliably read information stored by the memory cells even if the threshold voltages of the memory cells shift over time. An offset value may refer the value used to adjust the writing voltage for a threshold voltage or associated bit value.

The system 100 may include any quantity of non-transitory computer readable media that support read window management in a memory system. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

FIG. 2 illustrates an example of a set of threshold voltage (Vt) distribution curves 200 that supports read window management in a memory system in accordance with examples as disclosed herein. The set of Vt distribution curves 200 may be an example of Vt distribution curves for triple-level cells (TLCs), where a triple-level cell refers to a memory cell that is configured to store three bits using eight threshold levels. So, the set of Vt distribution curves 200 may include eight Vt distribution curves (labeled L0 through L7) for eight target Vt values, each target Vt value of which may represent or be associated with a respective multi-bit value. For example, target Vt 0 may represent bit value 111, target Vt value 1 may represent bit value 110, and so on and so forth as illustrated in FIG. 2. The Vt distribution curve for a target Vt value may indicate for various Vt values the quantity of memory cells with those Vt values.

Although described with reference to triple-level cells, the techniques described herein can be implemented using any type of threshold-voltage based memory cell, including single-level cells (SLCs) that are configured to store a single bit using two threshold voltage levels, bi-level cells (BLCs) that are configured to store two bits using four threshold voltages, and qual-level cells (QLCs) that are configured to store four bits using sixteen threshold voltage levels. In general, a memory cell may store n bits using $2^n$ threshold voltage levels.

A Vt distribution curve for a bit value may be determined by reading memory cells written with that bit value and plotting the quantity of memory cells with a given threshold value. The Vt distribution curve for a bit value may be more or less centered around the target Vt value for that bit value. For example, the Vt distribution for bit value 111 may be more or less centered about target Vt 0. To differentiate between bit values during a read operation, a memory system may use read voltages that are more or less centered between adjacent target Vt values. For example, the read voltage for differentiating between bit value 111 and bit value 011 (denoted Rd1) may be equidistant from, or otherwise positioned between, the target Vt values for bit value 111 and bit value 011.

The distance between two Vt distribution curves (or between a Vt distribution curve and a read voltage) may be referred to as a read window. For example, the distance between Vt distribution curve L7 and Vt distribution curve L6 may be referred to as read window v6. Similarly, the distance between Vt distribution curve L6 and Vt distribution curve L5 may be referred to as read window v5. And so on and so forth. Combinations of read windows may also be referred to as read windows (e.g., adding read window v2 and read window v6 may give read window A). Due to noise issues associated with the Vt distribution curve L0, the read window el may be defined as the distance between Vt distribution curve L1 and the read voltage Rd1. In some examples, the distance between two Vt distribution curves may be measured from respective reference points (e.g., given by 205) along the curves that are associated with a threshold percentage of the memory cells written with the bit value associated with that Vt distribution curve.

Initially (e.g., a time to, after writing the memory cells), the set of Vt distribution curves 200 may appear as shown by the solid lines in the lower illustration of FIG. 2. However, over time (e.g., at time t1) the Vt distribution curves 200 may shift as shown by the dashed lines in the lower illustration of FIG. 2. Accordingly, the read windows (e.g., the voltage windows between Vt distribution curves) may compress, which may reduce the ability of the memory system to reliably distinguish between bit values during read operations (resulting in read errors). The amount of threshold voltage shift and read window compression experienced by a set of memory cells may vary with the target threshold voltage and the quantity of access operations (e.g., write operations, erase operations) performed on the set of memory cells. In some examples, the quantity of write operations and erase operations performed on a set of memory cells may be referred to as the programming-and-erase cycle (PEC) for the set of memory cells.

Because larger read windows reduce the quantity of memory cells that ultimately drift past the read voltages, larger read windows may be associated with higher reliability. However, because higher write voltages (which stress memory cells) are used to create larger read windows, larger read windows may also be associated with reduced endurance. Endurance may refer to the quantity or access operations a memory system can perform at a threshold reliability. Thus, the size of the read windows may impact both reliability and endurance, with larger read windows improving reliability but harming endurance and smaller read windows improving endurance but impairing reliability.

To increase reliability without unnecessarily decreasing endurance, a memory system may adaptively set the size of the read windows by using offset values to adjust the target Vt values for write operations. For example, the memory system may use an offset value for bit value 110 to shift the target Vt value (and thus the Vt distribution curve) so that the voltage window v6 is increased. Rather than using static offset values, which may not be tailored to the memory system and which may result in insufficient write voltages (that reduce reliability) or excessively high write voltages (that negatively impact endurance), the memory system may adaptively set the offset values based on the Vt distribution curves of the memory system. Such a technique may allow the memory system to use write voltages that are high enough to achieve a threshold reliability without unnecessarily stressing the memory cells.

To adaptively set the offset values, the memory system may first determine the set of Vt distribution curves 200 (e.g., by reading a set of written memory cells). The memory system may then use the set of Vt distribution curves 200 to determine various read windows, which may be combinations of one or more read windows. Based on the read windows, the memory system predict read windows for the set of memory cells in the future (e.g., after a threshold amount of time has elapsed, after a threshold quantity of PECs have been performed). Because error rates are a function of read window size, the memory system may use the predicted read windows to predict error rate(s) for the set of memory cells. Next, the memory system may use the predicted error rate(s) to adjust the offset values for the target Vt values, and in doing so may effectively increase (or otherwise modify) the size of the read windows so that reliability is improved without unnecessarily compromising endurance.

Figure 3:
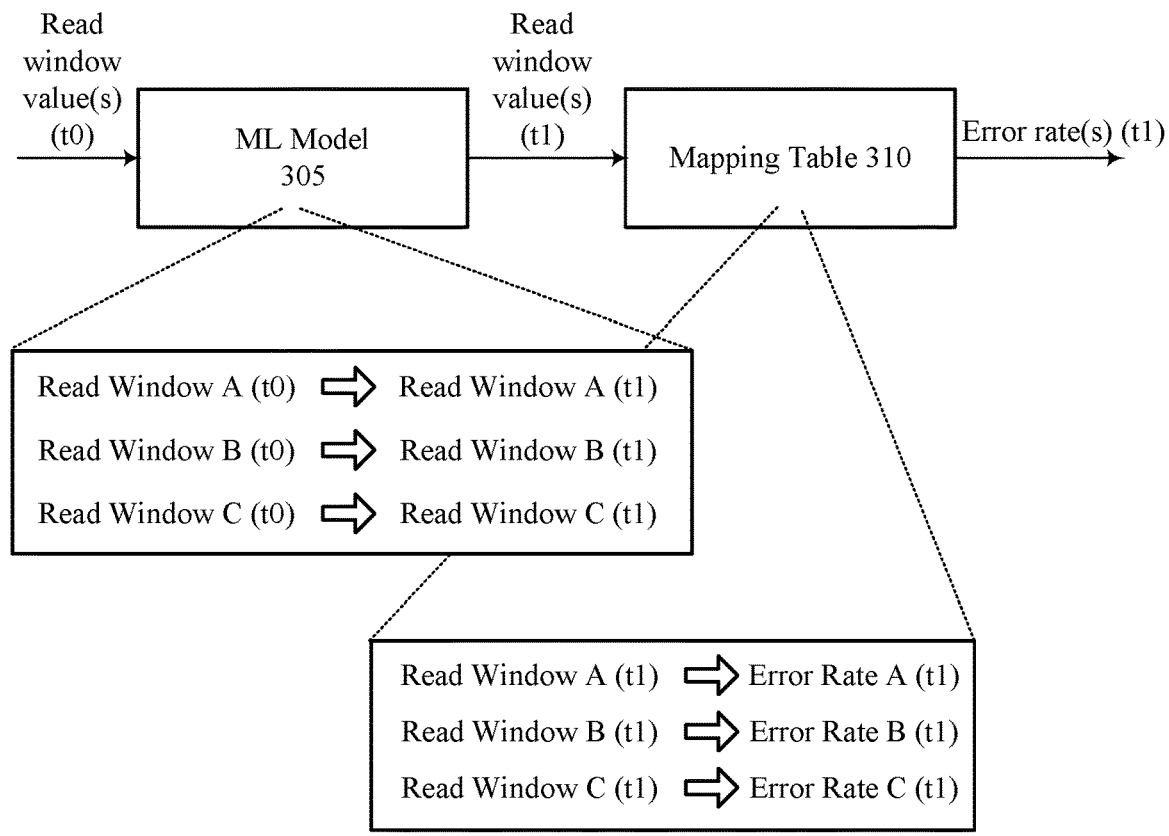
FIG. 3 illustrates an example of a processing path that supports read window management in a memory system in accordance with examples as disclosed herein.
Figure 3:
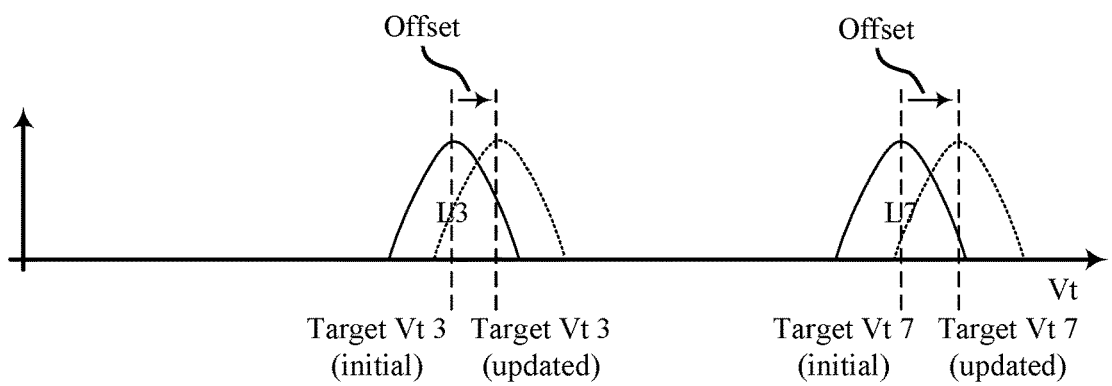

FIG. 3 illustrates an example of a processing path 300 that supports read window management in a memory system in accordance with examples as disclosed herein. The processing path 300 may be included in a memory system as described herein. The processing path 300 may include a machine learning (ML) model 305 and a mapping table 310, which may be a look-up-table or other type of table or mapping structure. A memory system may use the processing path 300 to adaptively set offset values for writing a set of memory cells.

The machine learning model 305 may operate on (e.g., be applied to) read window values that are determined at time t0 from a Vt distribution curve such as the Vt distribution curve 200. Time t0 may occur within a threshold amount of time of writing the set or memory cells used to generate the Vt distribution curve 200. The machine learning model 305 may be configured to predict voltage window values at time t1, where time t1 is after time to.

In some examples (e.g., for TLCs), the read window values input into the machine learning model 305 may include read window A, read window B, and read window C. In some examples, read window A may correspond to extra page (XP) data, read window B may correspond to upper page (UP) data, and read window C may correspond to lower page (LP) data. Extra page data may refer to the most significant bit (MSB) stored by a triple-level cell, upper page data may refer to the middle bit stored by a triple-level cell, and lower page data may refer to the least significant bit (LSB) stored by a triple-level cell. Accordingly, read window A may be based on (e.g., a function of, the summation of) read windows v2 and v6; read window B may be based on read windows v1, v3, and v5; and read window C may be based on read windows el and v6. The values of the read windows may also be referred to as the size of the read windows, the distance of the read windows, or other suitable terminology.

The machine learning model 305 may use the read window values determined at time t0 to predict read window values at time t1, where time t1 is after time t0. For example, the machine learning model 305 may predict the value for read window A at time t1 based on value for read window A at time t0. Similarly, the machine learning model 305 may predict the value for read window B at time t1 based on value for read window B at time t0. And the machine learning model 305 may predict the value for read window C at time t1 based on value for read window C at time t0. The machine learning model 305 may be trained to predict the read window values as described with reference to FIG. 4.

The mapping table 310 may map predicted read window values to predicted error rates. So, the memory system may use the mapping table 310 to predict error rates for the set of memory cells at time t1 based on the predicted read window values predicted for time t1. For instance, the memory system may use the mapping table 310 to predict the error rate associated with read window A (referred to as error rate A) at time t1 based on the predicted value for read window A at time t1. Similarly, the memory system may use the mapping table 310 to predict the error rate associated with read window B (referred to as error rate B) at time t1 based on the predicted value for read window B at time t1. And the memory system may use the mapping table 310 to predict the error rate associated with read window C (referred to as error rate C) at time t1 based on the predicted value for read window C at time t1.

After predicting error rates at time t1, the memory system may use the predicted error rates to set offset values that move the target Vt values for writing and impact the size of the read windows. For example, if the error rate associated with read window A (e.g., error rate A) is greater than a threshold error rate, the memory system may set the offset values for target Vt 3 (e.g., the target Vt value associated with read window v2) and/or target Vt 7 (the target Vt value associated with read window v6). In some examples, setting the offset value may involve adding an adjustment value to an initial value of the offset value (e.g., the memory system may increase the target Vt 3 and target Vt 7 relative to the values previously used to write the set of memory cells).

Thus, a memory system may use the processing path 300 to adaptively set offset values for writing a set of memory cells, which may improve the performance of the set of memory cells. Although described with reference to certain voltage windows, the techniques described herein may be used for other voltage windows, including other quantities of voltage windows. Although described with reference to a machine learning model, a memory system may use another mechanism, such as a look-up table, to predict future read windows from present read windows.

Figure 4:
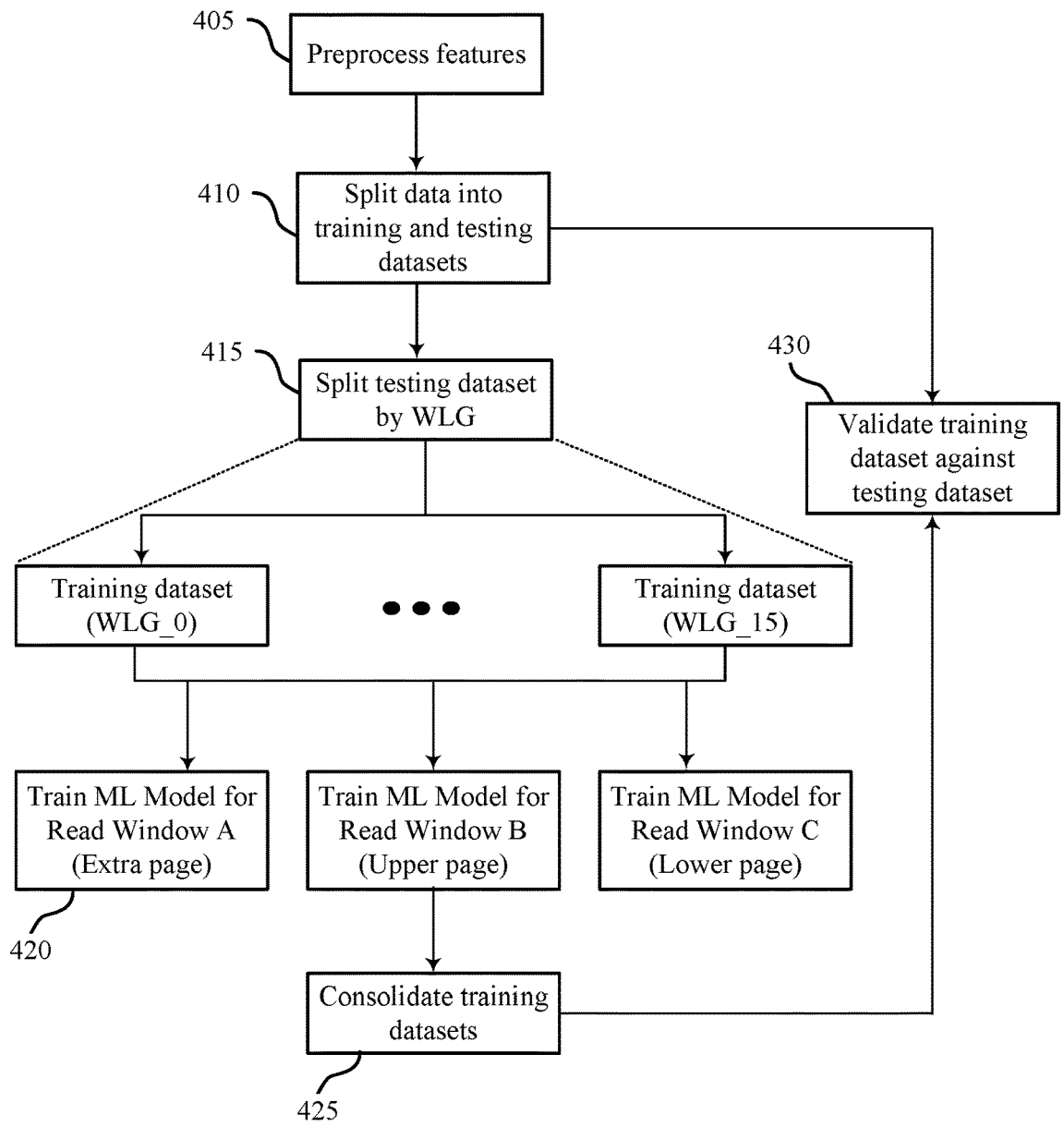
FIG. 4 illustrates an example of a flow chart that supports read window management in a memory system in accordance with examples as disclosed herein.

FIG. 4 illustrates an example of a flow chart 400 that supports read window management in a memory system in accordance with examples as disclosed herein. Aspects of the flow chart 400 may be used by a memory system to train a machine learning model to predict voltage windows at time t1 based on voltage windows determined at time to, which may occur before time t1.

At 405, the memory system may preprocess the features to be used in training the machine learning model. For example, the memory system process the features to reduce noise. Additionally, the memory system may normalize various features for training the machine learning model. The features used by the machine learning model may be read windows determined at time t0.

In some examples, the features (denoted xi) used by the machine learning model to predict read window values at time t1 (denoted y) may include read windows from a Vt distribution curve as described herein. For example, the features used to predict read window A (which may be associated with the extra page data) may be read window v2, read window v6, and the programming/erase cycles (PECs) for the set of memory cells involved in the training. A programming/erase cycle may also be referred to as a quantity of write operations and erase operations. The features used to predict read window B (which may be associated with the upper page data) may be read window v1, read window v3, read window v5, and the PECs for the set of memory cells involved in the training. The features used to predict read window C (which may be associated with the lower page data) may be read window el, read window v4, and the PECs for the set of memory cells involved in the training.

In some examples, the machine learning model may be a linear regression model defined by $y=c_0+c_p \cdot x_p$, where y is the predicted read window at time t1, $c_i$ is the coefficient for a feature $x_i$, and p is an integer.

At 410, the machine learning model may split the features into datasets. For example, the machine learning model may randomly split the features into a training data set and a testing dataset. In some examples, the machine learning model may split the features on a die basis (e.g., given 100 dies, the machine learning model may use the features from 80 dies for training and the features from 20 dies for testing and validation). In some examples, the features for testing (e.g., the testing dataset) may be read window values determined after "baking" the dies, where baking refers to the process of subjecting the dies to a threshold temperature for a threshold duration of time.

At 415, the machine learning model may split the training dataset by word line group (WLG). That is, the machine learning model may group the training features from each word line group. In some examples, there may be sixteen word line groups (e.g., WLG_0 through WLG_15). However, other quantities of word line groups are contemplated and within the scope of the present disclosure.

After splitting the training dataset by word line group, the machine learning model may, for each word line group, perform training for the read windows (e.g., read window A, read window B, read window C, which correspond to different page types). For example, at 420, the machine learning model may, for each word line group, perform training for read window A (which corresponds to the extra page data), perform training for read window B (which corresponds to the upper page data), and perform training for read window C (which corresponds to the lower page data).

At 425, the machine learning model may consolidate the training datasets from the word line groups for validation. At 430, the machine learning model may validate the training dataset against the testing dataset. For example, the machine learning model may compare the training dataset (e.g., the predicted read window) with the testing dataset (e.g., the data determined after baking the dies) to determine a correlation between read windows at time t0 and read windows at time t1 (e.g., after baking).

Thus, a memory system may implement the flow chart 400 to train a machine learning model to predict voltage windows at time t1 based on voltage windows determined at time to.

Figure 5:
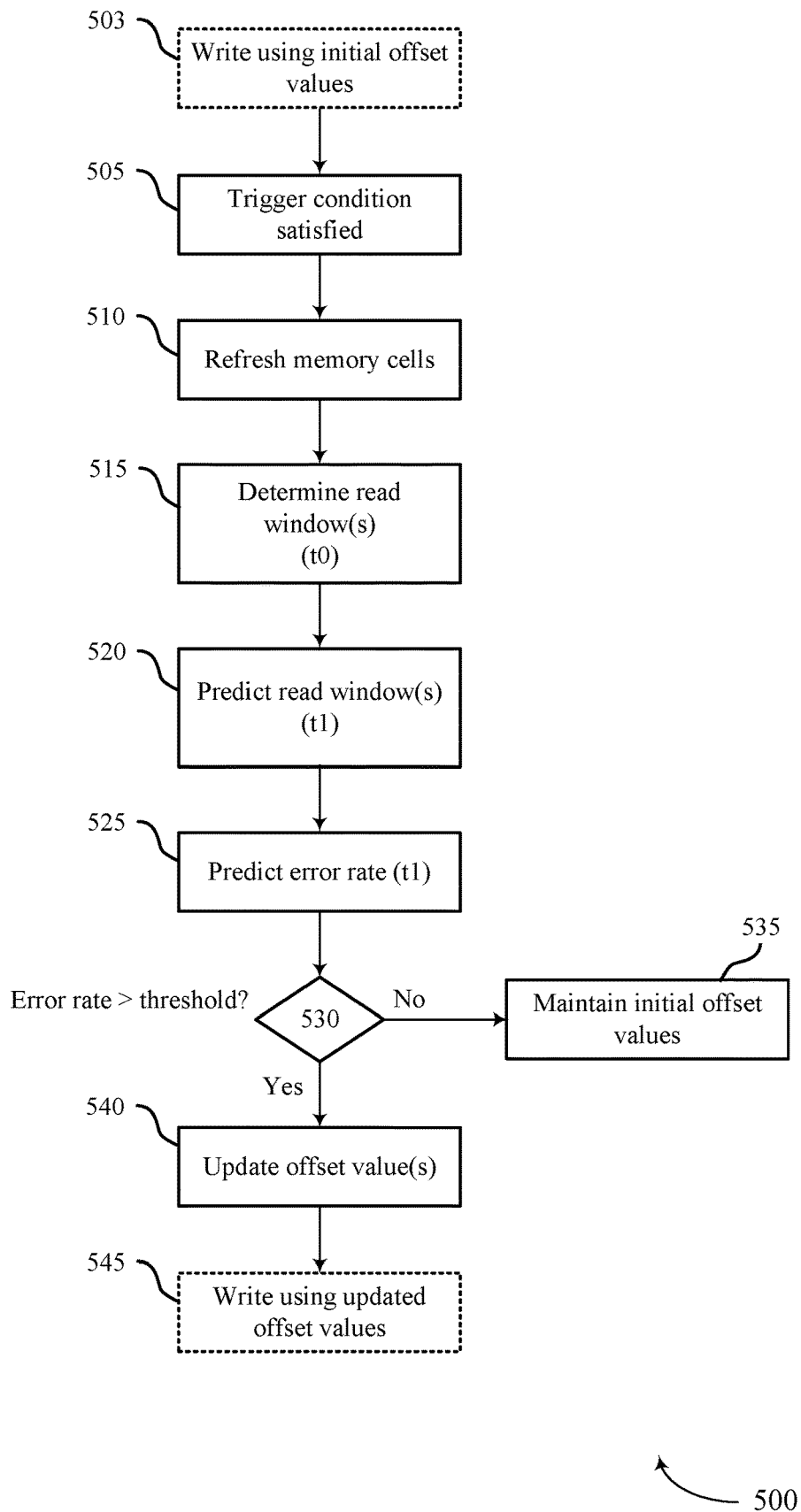
FIG. 5 illustrates an example of a flow chart that supports read window management in a memory system in accordance with examples as disclosed herein.

FIG. 5 illustrates an example of a flow chart 500 that supports read window management in a memory system in accordance with examples as disclosed herein. Aspect of the flow chart 500 may be implemented by a memory system as described herein. The memory system may implement aspects of the flow chart 500 to adaptively manage read windows for a set of memory cells. In some examples, the set of memory cells may include a sampling page from each word line group involved in the read window management process.

At 503, the memory system may write the set of memory cells using initial offset values for the target Vt voltages. In some examples, there may be an initial offset value per target Vt voltage (e.g., there may eight initial offset values for eight target Vt voltages). The term "initial" may be used to differentiate a value for a metric from an updated value for the metric and may not be limited to the first value for the metric.

At 505, the memory system may determine that a trigger condition for performing read window management has been satisfied. In some examples, the trigger condition may be the set of memory cells reaching a threshold quantity of PECs. For example, the memory system may determine to perform read window management based on determining that the quantity of PECs performed on the set of memory cells satisfies (e.g., is greater than or equal to) a threshold quantity of PECs. Put another way, the memory system may determine to perform read window management based on determining that a threshold quantity of access operations (e.g., write operations, erase operations, or both) has been performed on the set of memory cells. Because threshold voltage changes may be exacerbated as PEC quantities increase, using the PEC quantity as a trigger condition may allow the memory system to manage read windows at various points in the life cycle of the set of memory cells and adaptively compensate for PEC-related changes in threshold voltages.

At 510, the memory system may refresh the set of memory cells. Refreshing the set of memory cells may include reading the set of memory cells, erasing the set of memory cells, and writing (e.g., using the initial offset values) the read data from the set of memory cells back to the set of memory cells. In some examples, the memory system may refresh the set of memory cells based on the trigger condition being satisfied.

At 515, the memory system may determine one or more read windows for the set of memory cells. For example, the memory system may read the set of memory cells and determine a set of Vt distribution curves from which the one or more read windows (e.g., read window A, read window B, read window C) can be derived. The time at which the memory system determines the read window(s) may be referred to as time to. In some examples, the memory system may determine the read window(s) based on (e.g., in response to) refreshing the set of memory cells.

At 520, the memory system may use the one or more read windows determined at 515 to predict (e.g., estimate, determine) one or more read windows at time t1, which may be after time t0. For example, the memory system may use read window A(t0) to predict read window A(t1), may use read window B(t0) to predict read window B(t1), may use read window C(t0) to predict read window C(t1), or any combination thereof. In some examples, the memory system may use a machine learning model to predict the read window(s) at time t1.

At 525, the memory system may use the one or more read windows predicted at 520 to predict (e.g., determine, estimate) an error rate for the set of memory cells at time t1. For example, the memory system may use read window A(t1) to predict error rate A(t1) (e.g., the error rate associated with read window A and the extra page data). Additionally or alternatively, the memory system may use read window B(t1) to predict error rate B(t1) (e.g., the error rate associated with read window B and the upper page data). Additionally or alternatively, the memory system may use read window C(t1) to predict error rate C(t1) (e.g., the error rate associated with read window C and the lower page data). In some examples, the memory system may use a look-up-table to predict the error rate(s). The look-up-table may map predicted read windows to predicted error rates.

At 530, the memory system may determine whether one or more predicted error rates exceed a threshold. For example, the system may compare error rate A(t1) with a threshold error rate. Additionally or alternatively, the system may compare error rate B(t1) with the threshold error rate. Additionally or alternatively, the system may compare error rate C(t1) with the threshold error rate.

If, at 530, the memory system determines that no predicted error rate exceeds the threshold, the memory system may, at 535, maintain the read windows by maintaining the initial offset values for writing the set of memory cells.

If, at 530, the memory system determines that one or more predicted error rates exceed the threshold, the memory system may, at 540, modify one or more read windows by updating the offset values for writing the set of memory cells. For example, if error rate A(t1) exceeds the threshold, the memory system may update the offset values for the threshold voltages associated with read window A (e.g., target Vt value 3, target Vt value 7). If error rate B(t1) exceeds the threshold, the memory system may update the offset values for the threshold voltages associated with read window B (e.g., target Vt value 2, target Vt value 4, target Vt value 6). If error rate C(t1) exceeds the threshold, the memory system may update the offset values for the threshold voltages associated with read window C (e.g., target Vt value 1, target Vt value 5). In some examples, updating an offset value may include adding an adjustment value to initial or previously used offset value. In some examples, the adjustment value may be based on (e.g., proportional to) the error rate (e.g., larger error rates may be associated with larger adjustment values).

After updating the offset values, the memory system may use the updated offset values to write the set of memory cells. For example, at 545, the memory system may write the set of memory cells using the updated offset values for the target Vt voltages.

Thus, the memory system may implement aspects of the flow chart 500 to adaptively manage read windows for a set of memory cells.

Figure 6:
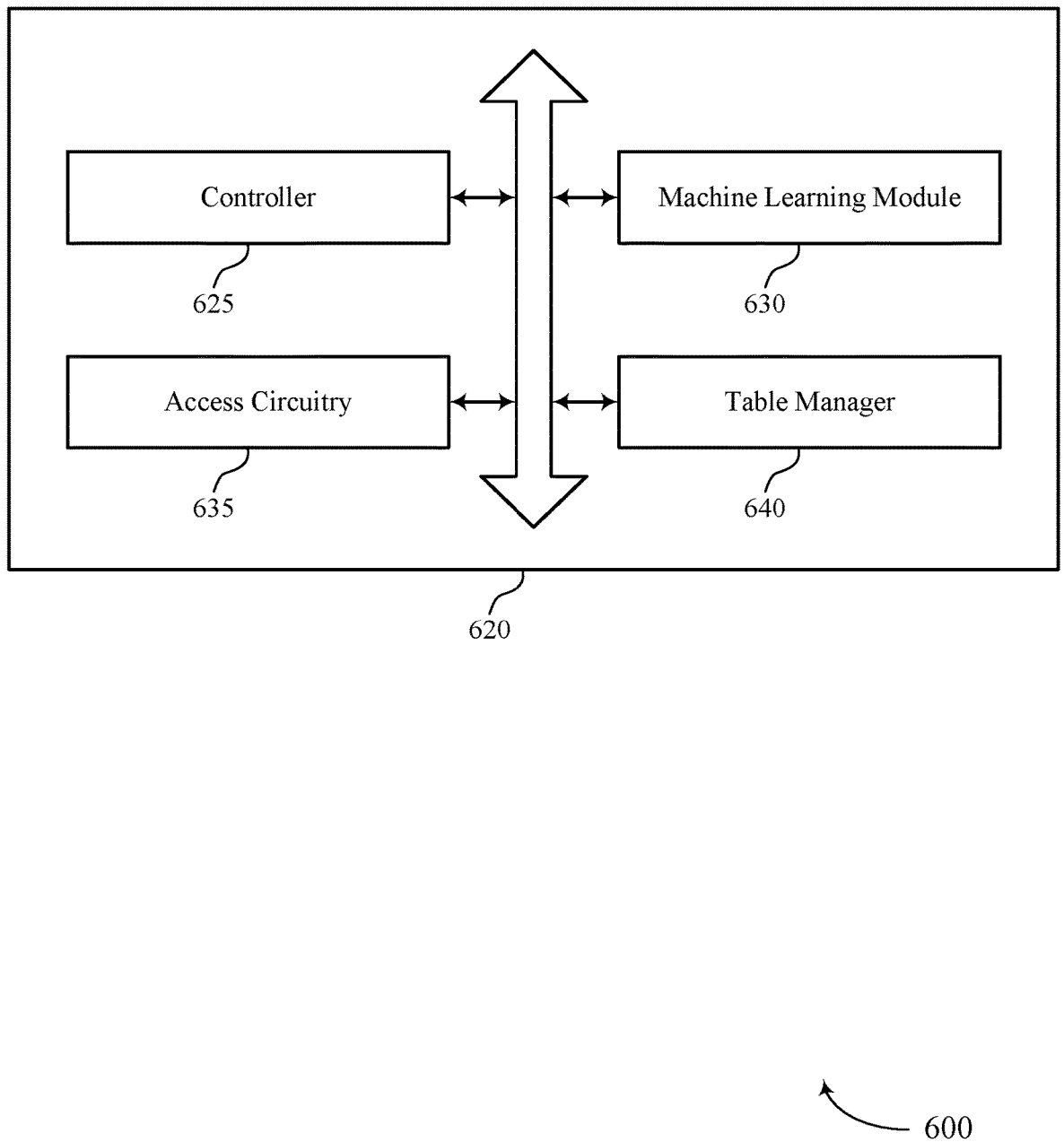
FIG. 6 shows a block diagram of a memory system that supports read window management in a memory system in accordance with examples as disclosed herein.

FIG. 6 shows a block diagram 600 of a memory system 620 that supports read window management in a memory system in accordance with examples as disclosed herein. The memory system 620 may be an example of aspects of a memory system as described with reference to FIGS. 1 through 5. The memory system 620, or various components thereof, may be an example of means for performing various aspects of read window management in a memory system as described herein. For example, the memory system 620 may include a controller 625, a machine learning module 630, an access circuitry 635, a table manager 640, or any combination thereof. Each of these components may communicate, directly or indirectly, with one another (e.g., via one or more buses).

The controller 625 may be configured as or otherwise support a means for determining, for a set of memory cells, a first value for a read window associated with a set of one or more threshold voltages that each represent a different multi-bit value. The read window may be read window A, read window B, read window C, or one or more of the read windows el through v6. The machine learning module 630 may be configured as or otherwise support a means for predicting, for the set of memory cells, a second value for the read window based at least in part on the first value. In some examples, the controller 625 may be configured as or otherwise support a means for predicting an error rate for the set of memory cells based at least in part on the second value for the read window. In some examples, the controller 625 may be configured as or otherwise support a means for setting a value for an offset for a threshold voltage of the set of one or more threshold voltages based at least in part on the error rate.

In some examples, the access circuitry 635 may be configured as or otherwise support a means for writing to at least one memory cell of the set of memory cells using the value for the offset for the threshold voltage.

In some examples, the controller 625 may be configured as or otherwise support a means for determining that the error rate for the set of memory cells satisfies a threshold error rate, where the value for the offset is set based at least in part on the error rate satisfying the threshold error rate.

In some examples, to support setting the value for the offset, the controller 625 may be configured as or otherwise support a means for adding an adjustment value to an initial value for the offset for the threshold voltage based at least in part on the error rate satisfying the threshold error rate.

In some examples, the controller 625 may be configured as or otherwise support a means for determining that a threshold quantity of access operations has been performed on the set of memory cells. In some examples, the access circuitry 635 may be configured as or otherwise support a means for performing a refresh operation on the set of memory cells based at least in part on determining that the threshold quantity of access operations has been performed on the set of memory cells, where the first value for the read window is determined based at least in part on performing the refresh operation.

In some examples, the machine learning module 630 may be configured as or otherwise support a means for applying a machine learning model to the first value for the read window, where the second value for the read window is based at least in part on applying the machine learning model to the first value.

In some examples, the table manager 640 may be configured as or otherwise support a means for determining, based at least in part a look-up table that maps predicted values for read windows to predicted error rates, that the second value is mapped to the error rate, where the error rate is predicted based at least in part on the determination.

In some examples, the controller 625 may be configured as or otherwise support a means for determining a difference between a first distribution curve for the set of one or more threshold voltages (e.g., Vt distribution curve L2) and a second distribution curve for the set of one or more threshold voltages (e.g., Vt distribution curve L3), where the first value for the read window (e.g., read window v2 or read window A) is based at least in part on the difference between the first distribution curve for the set of one or more threshold voltages and the second distribution curve for the set of one or more threshold voltages.

In some examples, the controller 625 may be configured as or otherwise support a means for determining a second difference between a third distribution curve for the set of one or more threshold voltages (e.g., Vt distribution curve L6) and a fourth distribution curve for the set of one or more threshold voltages (e.g., Vt distribution curve L7), where the first value for the read window (e.g., read window A) is based at least in part on the second difference between the third distribution curve for the set of one or more threshold voltages and the fourth distribution curve for the set of one or more threshold voltages.

In some examples, the controller 625 may be configured as or otherwise support a means for determining a difference between a distribution curve (e.g., Vt distribution curve L1) for the set of one or more threshold voltages and a read voltage (e.g., read voltage Rd1) associated with the distribution curve, where the first value for the read window (e.g., read window e1 or read window C) is based at least in part on the difference between the distribution curve for the set of one or more threshold voltages and the read voltage associated with the distribution curve.

The access circuitry 635 may be configured as or otherwise support a means for writing a set of memory cells using an initial value for an offset for a threshold voltage of a set of threshold voltages that each represent a different multi-bit value. In some examples, the controller 625 may be configured as or otherwise support a means for determining, for the set of memory cells after writing to the set of memory cells, a value for a read window associated with a subset of the set of threshold voltages. In some examples, the controller 625 may be configured as or otherwise support a means for determining an updated value for the offset for the threshold voltage based at least in part on the value for the read window. In some examples, the access circuitry 635 may be configured as or otherwise support a means for writing the set of memory cells using the updated value for the offset for the threshold voltage based at least in part on determining the updated value.

In some examples, the machine learning module 630 may be configured as or otherwise support a means for predicting, for the set of memory cells, a second value for the read window based at least in part on the value for the read window, where the updated value for the offset for the threshold voltage is based at least in part on the second value for the read window.

In some examples, the table manager 640 may be configured as or otherwise support a means for predicting an error rate for the set of memory cells based at least in part on the value for the read window, where the updated value for the offset for the threshold voltage is based at least in part on the error rate.

In some examples, the controller 625 may be configured as or otherwise support a means for determining that the error rate for the set of memory cells satisfies a threshold error rate, where the value for the offset is set based at least in part on the error rate satisfying the threshold error rate.

In some examples, the updated value for the offset includes the initial value plus an adjustment value that is based at least in part on the error rate.

In some examples, the machine learning module 630 may be configured as or otherwise support a means for predicting, for the set of memory cells, a second value for the read window based at least in part on the value for the read window. In some examples, the table manager 640 may be configured as or otherwise support a means for determining a mapping between the second value for the read window and the error rate, where the error rate is determined based at least in part on the mapping.

In some examples, the machine learning module 630 may be configured as or otherwise support a means for applying a machine learning model to the initial value for the read window, where the updated value for the offset for the threshold voltage is based at least in part on applying the machine learning model to the initial value.

In some examples, the controller 625 may be configured as or otherwise support a means for determining, based at least in part on writing to the set of memory cells, that a threshold quantity of access operations has been performed on the set of memory cells. In some examples, the access circuitry 635 may be configured as or otherwise support a means for performing a refresh operation on the set of memory cells based at least in part on determining that the threshold quantity of access operations has been performed on the set of memory cells, where the initial value for the read window is determined based at least in part on performing the refresh operation.

In some examples, the controller 625 may be configured as or otherwise support a means for determining a set of distribution curves for a subset of the set of threshold voltages based at least in part on writing the set of memory cells, where the initial value is based at least in part on the set of distribution curves.

Figure 7:
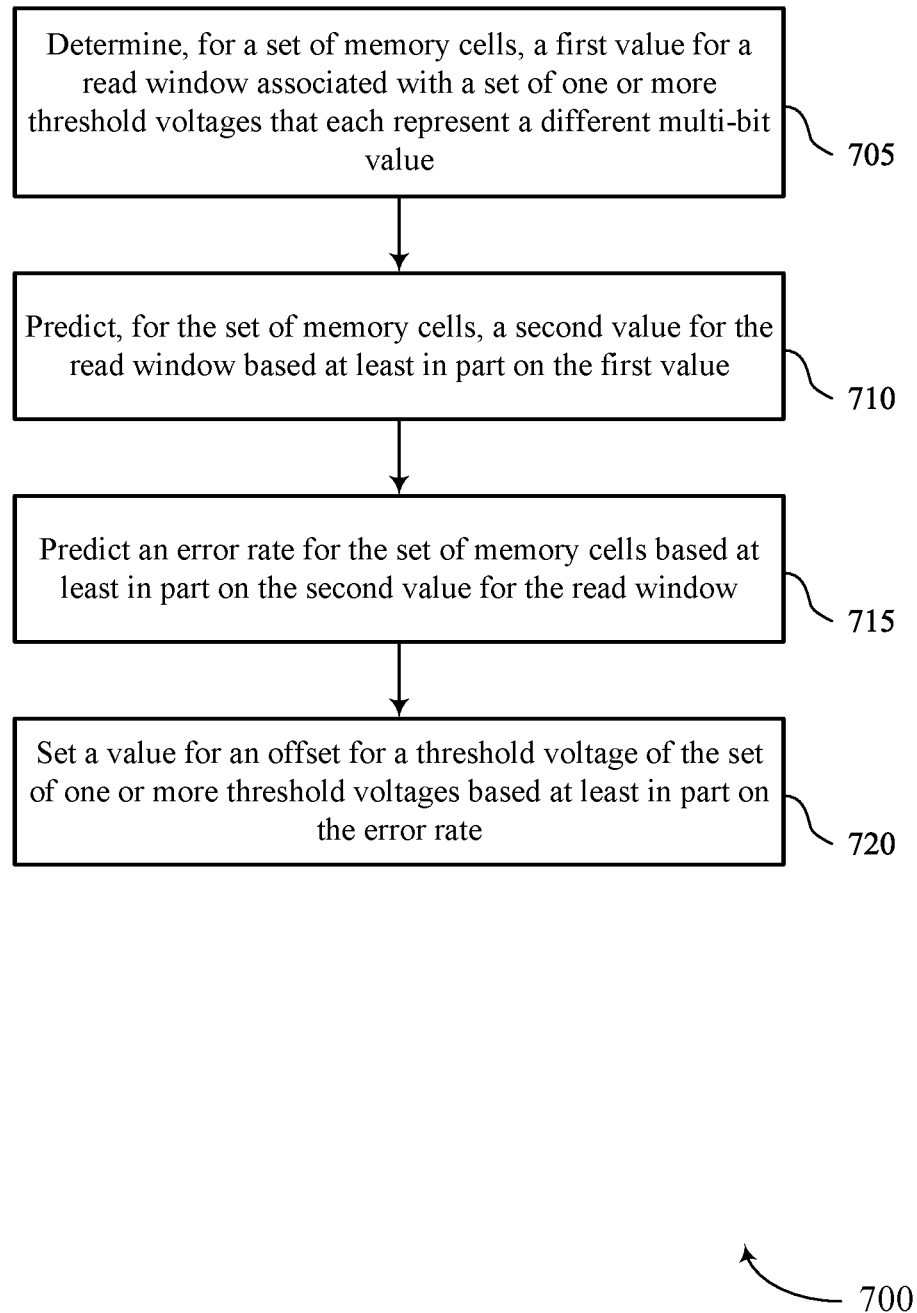
FIGS. 7 and 8 show flowcharts illustrating a method or methods that support read window management in a memory system in accordance with examples as disclosed herein.

FIG. 7 shows a flowchart illustrating a method 700 that supports read window management in a memory system in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include determining, for a set of memory cells, a first value for a read window associated with a set of one or more threshold voltages that each represent a different multi-bit value. The read window may be read window A, read window B, read window C, or one or more of the read windows e1 through v6. The operations of 705 may be performed in accordance with examples as disclosed herein. In some examples, aspects of the operations of 705 may be performed by a controller 625 as described with reference to FIG. 6.

At 710, the method may include predicting, for the set of memory cells, a second value for the read window based at least in part on the first value. The operations of 710 may be performed in accordance with examples as disclosed herein. In some examples, aspects of the operations of 710 may be performed by a machine learning module 630 as described with reference to FIG. 6.

At 715, the method may include predicting an error rate for the set of memory cells based at least in part on the second value for the read window. The operations of 715 may be performed in accordance with examples as disclosed herein. In some examples, aspects of the operations of 715 may be performed by a controller 625 as described with reference to FIG. 6.

At 720, the method may include setting a value for an offset for a threshold voltage of the set of one or more threshold voltages based at least in part on the error rate. The operations of 720 may be performed in accordance with examples as disclosed herein. In some examples, aspects of the operations of 720 may be performed by a controller 625 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining, for a set of memory cells, a first value for a read window associated with a set of one or more threshold voltages that each represent a different multi-bit value; predicting, for the set of memory cells, a second value for the read window based at least in part on the first value; predicting an error rate for the set of memory cells based at least in part on the second value for the read window; and setting a value for an offset for a threshold voltage of the set of one or more threshold voltages based at least in part on the error rate.

Aspect 2: The method, apparatus, or non-transitory computer-readable medium of aspect 1, further including operations, features, circuitry, logic, means, or instructions, or any combination thereof for writing to at least one memory cell of the set of memory cells using the value for the offset for the threshold voltage.

Aspect 3: The method, apparatus, or non-transitory computer-readable medium of any of aspects 1 through 2, further including operations, features, circuitry, logic, means, or instructions, or any combination thereof for determining that the error rate for the set of memory cells satisfies a threshold error rate, where the value for the offset is set based at least in part on the error rate satisfying the threshold error rate.

Aspect 4: The method, apparatus, or non-transitory computer-readable medium of aspect 3, where setting the value for the offset includes operations, features, circuitry, logic, means, or instructions, or any combination thereof for adding an adjustment value to an initial value for the offset for the threshold voltage based at least in part on the error rate satisfying the threshold error rate.

Aspect 5: The method, apparatus, or non-transitory computer-readable medium of any of aspects 1 through 4, further including operations, features, circuitry, logic, means, or instructions, or any combination thereof for determining that a threshold quantity of access operations has been performed on the set of memory cells and performing a refresh operation on the set of memory cells based at least in part on determining that the threshold quantity of access operations has been performed on the set of memory cells, where the first value for the read window is determined based at least in part on performing the refresh operation.

Aspect 6: The method, apparatus, or non-transitory computer-readable medium of any of aspects 1 through 5, further including operations, features, circuitry, logic, means, or instructions, or any combination thereof for applying a machine learning model to the first value for the read window, where the second value for the read window is based at least in part on applying the machine learning model to the first value.

Aspect 7: The method, apparatus, or non-transitory computer-readable medium of any of aspects 1 through 6, further including operations, features, circuitry, logic, means, or instructions, or any combination thereof for determining, based at least in part a look-up table that maps predicted values for read windows to predicted error rates, that the second value is mapped to the error rate, where the error rate is predicted based at least in part on the determination.

Aspect 8: The method, apparatus, or non-transitory computer-readable medium of any of aspects 1 through 7, further including operations, features, circuitry, logic, means, or instructions, or any combination thereof for determining a difference between a first distribution curve for the set of one or more threshold voltages and a second distribution curve for the set of one or more threshold voltages, where the first value for the read window is based at least in part on the difference between the first distribution curve for the set of one or more threshold voltages and the second distribution curve for the set of one or more threshold voltages.

Aspect 9: The method, apparatus, or non-transitory computer-readable medium of aspect 8, further including operations, features, circuitry, logic, means, or instructions, or any combination thereof for determining a second difference between a third distribution curve for the set of one or more threshold voltages and a fourth distribution curve for the set of one or more threshold voltages, where the first value for the read window is based at least in part on the second difference between the third distribution curve for the set of one or more threshold voltages and the fourth distribution curve for the set of one or more threshold voltages.

Aspect 10: The method, apparatus, or non-transitory computer-readable medium of any of aspects 1 through 9, further including operations, features, circuitry, logic, means, or instructions, or any combination thereof for determining a difference between a distribution curve for the set of one or more threshold voltages and a read voltage associated with the distribution curve, where the first value for the read window is based at least in part on the difference between the distribution curve for the set of one or more threshold voltages and the read voltage associated with the distribution curve.

Figure 8:
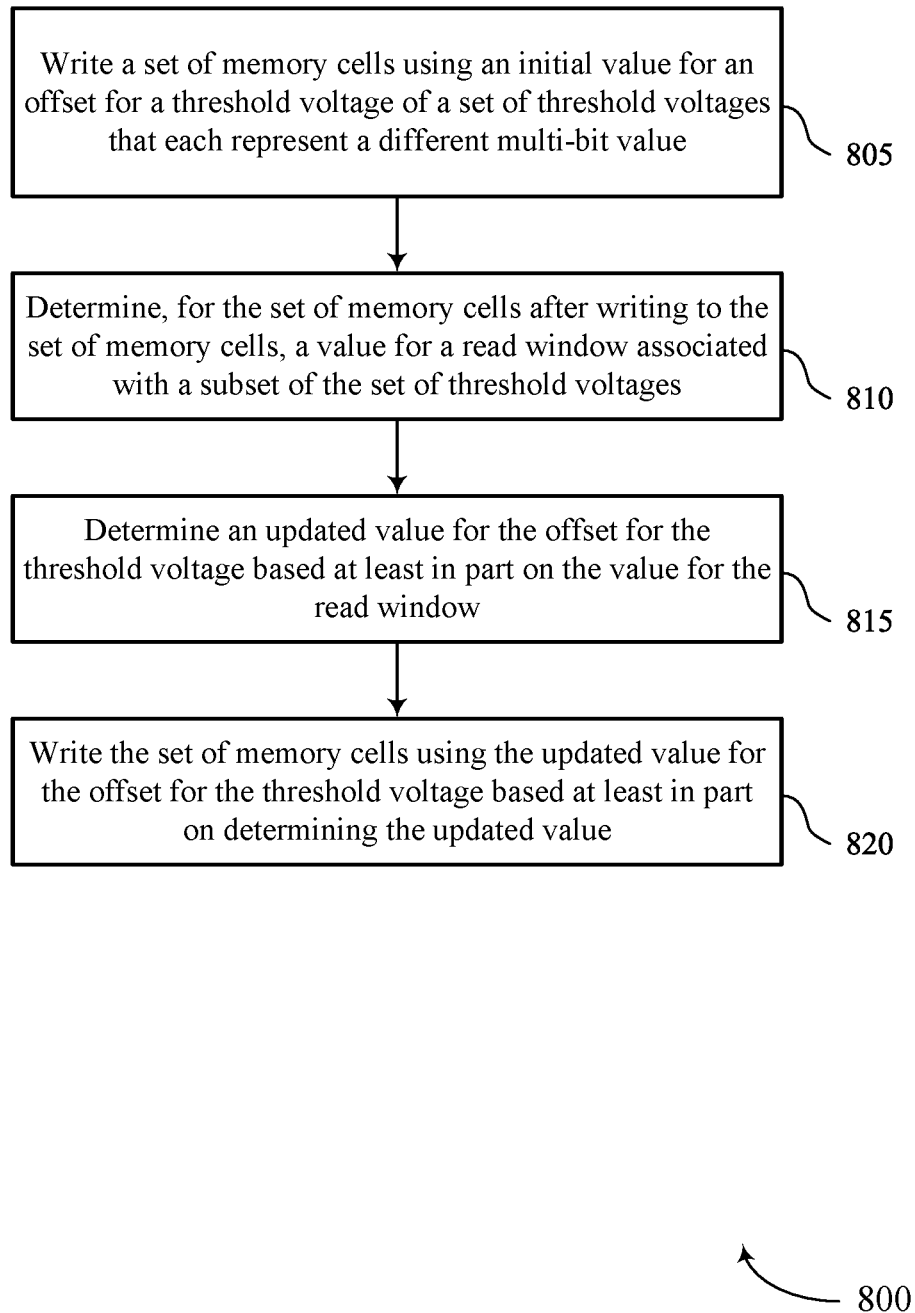

FIG. 8 shows a flowchart illustrating a method 800 that supports read window management in a memory system in accordance with examples as disclosed herein. The operations of method 800 may be implemented by a memory system or its components as described herein. For example, the operations of method 800 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 805, the method may include writing a set of memory cells using an initial value for an offset for a threshold voltage of a set of threshold voltages that each represent a different multi-bit value. The operations of 805 may be performed in accordance with examples as disclosed herein. In some examples, aspects of the operations of 805 may be performed by an access circuitry 635 as described with reference to FIG. 6.

At 810, the method may include determining, for the set of memory cells after writing to the set of memory cells, a value for a read window associated with a subset of the set of threshold voltages. The operations of 810 may be performed in accordance with examples as disclosed herein. In some examples, aspects of the operations of 810 may be performed by a controller 625 as described with reference to FIG. 6.

At 815, the method may include determining an updated value for the offset for the threshold voltage based at least in part on the value for the read window. The operations of 815 may be performed in accordance with examples as disclosed herein. In some examples, aspects of the operations of 815 may be performed by a controller 625 as described with reference to FIG. 6.

At 820, the method may include writing the set of memory cells using the updated value for the offset for the threshold voltage based at least in part on determining the updated value. The operations of 820 may be performed in accordance with examples as disclosed herein. In some examples, aspects of the operations of 820 may be performed by an access circuitry 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for writing a set of memory cells using an initial value for an offset for a threshold voltage of a set of threshold voltages that each represent a different multi-bit value; determining, for the set of memory cells after writing to the set of memory cells, a value for a read window associated with a subset of the set of threshold voltages; determining an updated value for the offset for the threshold voltage based at least in part on the value for the read window; and writing the set of memory cells using the updated value for the offset for the threshold voltage based at least in part on determining the updated value.

Aspect 12: The method, apparatus, or non-transitory computer-readable medium of aspect 11, further including operations, features, circuitry, logic, means, or instructions, or any combination thereof for predicting, for the set of memory cells, a second value for the read window based at least in part on the value for the read window, where the updated value for the offset for the threshold voltage is based at least in part on the second value for the read window.

Aspect 13: The method, apparatus, or non-transitory computer-readable medium of any of aspects 11 through 12, further including operations, features, circuitry, logic, means, or instructions, or any combination thereof for predicting an error rate for the set of memory cells based at least in part on the value for the read window, where the updated value for the offset for the threshold voltage is based at least in part on the error rate.

Aspect 14: The method, apparatus, or non-transitory computer-readable medium of aspect 13, further including operations, features, circuitry, logic, means, or instructions, or any combination thereof for determining that the error rate for the set of memory cells satisfies a threshold error rate, where the value for the offset is set based at least in part on the error rate satisfying the threshold error rate.

Aspect 15: The method, apparatus, or non-transitory computer-readable medium of any of aspects 13 through 14, where the updated value for the offset includes the initial value plus an adjustment value that is based at least in part on the error rate.

Aspect 16: The method, apparatus, or non-transitory computer-readable medium of any of aspects 13 through 15, further including operations, features, circuitry, logic, means, or instructions, or any combination thereof for predicting, for the set of memory cells, a second value for the read window based at least in part on the value for the read window and determining a mapping between the second value for the read window and the error rate, where the error rate is determined based at least in part on the mapping.

Aspect 17: The method, apparatus, or non-transitory computer-readable medium of any of aspects 11 through 16, further including operations, features, circuitry, logic, means, or instructions, or any combination thereof for applying a machine learning model to the initial value for the read window, where the updated value for the offset for the threshold voltage is based at least in part on applying the machine learning model to the initial value.

Aspect 18: The method, apparatus, or non-transitory computer-readable medium of any of aspects 11 through 17, further including operations, features, circuitry, logic, means, or instructions, or any combination thereof for determining, based at least in part on writing to the set of memory cells, that a threshold quantity of access operations has been performed on the set of memory cells and performing a refresh operation on the set of memory cells based at least in part on determining that the threshold quantity of access operations has been performed on the set of memory cells, where the initial value for the read window is determined based at least in part on performing the refresh operation.

Aspect 19: The method, apparatus, or non-transitory computer-readable medium of any of aspects 11 through 18, further including operations, features, circuitry, logic, means, or instructions, or any combination thereof for determining a set of distribution curves for a subset of the set of threshold voltages based at least in part on writing the set of memory cells, where the initial value is based at least in part on the set of distribution curves.

It should be noted that the described techniques include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 20: An apparatus, including: a memory including a set of memory cells; and a controller coupled with the memory and configured to cause the apparatus to: determine, for the set of memory cells, a first value for a read window associated with a set of one or more threshold voltages that each represent a different multi-bit value; predict, for the set of memory cells, a second value for the read window based at least in part on the first value; predict an error rate for the set of memory cells based at least in part on the second value for the read window; and set a value for an offset for a threshold voltage of the set of one or more threshold voltages based at least in part on the error rate.

Aspect 21: The apparatus of aspect 20, where the controller is further configured to cause the apparatus to: write to at least one memory cell of the set of memory cells using the value for the offset for the threshold voltage.

Aspect 22: The apparatus of any of aspects 20 through 21, where the controller is further configured to cause the apparatus to: determine that the error rate for the set of memory cells satisfies a threshold error rate, where the value for the offset is set based at least in part on the error rate satisfying the threshold error rate.

An apparatus is described. The following provides an overview of aspects of the apparatus as described herein:

Aspect 23: An apparatus, including: a memory including a set of memory cells; and a controller coupled with the memory and configured to cause the apparatus to: write the set of memory cells using an initial value for an offset for a threshold voltage of a set of threshold voltages that each represent a different multi-bit value; determine, for the set of memory cells after writing to the set of memory cells, a value for a read window associated with a subset of the set of threshold voltages; determine an updated value for the offset for the threshold voltage based at least in part on the value for the read window; and write the set of memory cells using the updated value for the offset for the threshold voltage based at least in part on determining the updated value.

Aspect 24: The apparatus of aspect 23, where the controller is further configured to cause the apparatus to: predict, for the set of memory cells, a second value for the read window based at least in part on the value for the read window, where the updated value for the offset for the threshold voltage is based at least in part on the second value for the read window.

Aspect 25: The apparatus of any of aspects 23 through 24, where the controller is further configured to cause the apparatus to: predict an error rate for the set of memory cells based at least in part on the value for the read window, where the updated value for the offset for the threshold voltage is based at least in part on the error rate.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action)

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   determining, for a set of memory cells, a first value for a read window associated with a set of one or more threshold voltages that each represent a different multi-bit value;
   predicting, for the set of memory cells, a second value for the read window based at least in part on the first value;
   predicting an error rate for the set of memory cells based at least in part on the second value for the read window; and
   setting a value for an offset for a threshold voltage of the set of one or more threshold voltages based at least in part on the error rate.

2. The method of claim 1, further comprising:
   writing to at least one memory cell of the set of memory cells using the value for the offset for the threshold voltage.

3. The method of claim 1, further comprising:
   determining that the error rate for the set of memory cells satisfies a threshold error rate, wherein the value for the offset is set based at least in part on the error rate satisfying the threshold error rate.

4. The method of claim 3, wherein setting the value for the offset comprises:
   adding an adjustment value to an initial value for the offset for the threshold voltage based at least in part on the error rate satisfying the threshold error rate.

5. The method of claim 1, further comprising:
   determining that a threshold quantity of access operations has been performed on the set of memory cells; and
   performing a refresh operation on the set of memory cells based at least in part on determining that the threshold quantity of access operations has been performed on the set of memory cells, wherein the first value for the read window is determined based at least in part on performing the refresh operation.

6. The method of claim 1, further comprising:
   applying a machine learning model to the first value for the read window, wherein the second value for the read window is based at least in part on applying the machine learning model to the first value.

7. The method of claim 1, further comprising:
   determining, based at least in part a look-up table that maps predicted values for read windows to predicted error rates, that the second value is mapped to the error rate, wherein the error rate is predicted based at least in part on the determination.

8. The method of claim 1, further comprising:
   determining a difference between a first distribution curve for the set of one or more threshold voltages and a second distribution curve for the set of one or more threshold voltages, wherein the first value for the read window is based at least in part on the difference between the first distribution curve for the set of one or more threshold voltages and the second distribution curve for the set of one or more threshold voltages.

9. The method of claim 8, further comprising:
   determining a second difference between a third distribution curve for the set of one or more threshold voltages and a fourth distribution curve for the set of one or more threshold voltages, wherein the first value for the read window is based at least in part on the second difference between the third distribution curve for the set of one or more threshold voltages and the fourth distribution curve for the set of one or more threshold voltages.

10. The method of claim 1, further comprising:
    determining a difference between a distribution curve for the set of one or more threshold voltages and a read voltage associated with the distribution curve, wherein the first value for the read window is based at least in part on the difference between the distribution curve for the set of one or more threshold voltages and the read voltage associated with the distribution curve.

11. An apparatus, comprising:
    a memory comprising a set of memory cells; and
    a controller coupled with the memory and configured to cause the apparatus to:
    determine, for the set of memory cells, a first value for a read window associated with a set of one or more threshold voltages that each represent a different multi-bit value;
    predict, for the set of memory cells, a second value for the read window based at least in part on the first value;
    predict an error rate for the set of memory cells based at least in part on the second value for the read window; and
    set a value for an offset for a threshold voltage of the set of one or more threshold voltages based at least in part on the error rate.

12. The apparatus of claim 11, wherein the controller is further configured to cause the apparatus to:
   write to at least one memory cell of the set of memory cells using the value for the offset for the threshold voltage.

13. The apparatus of claim 11, wherein the controller is further configured to cause the apparatus to:
   determine that the error rate for the set of memory cells satisfies a threshold error rate, wherein the value for the offset is set based at least in part on the error rate satisfying the threshold error rate.

* * * * *